United States Patent [19]
Yoshihara et al.

[11] Patent Number: 5,824,177
[45] Date of Patent: Oct. 20, 1998

[54] METHOD FOR MANUFACTURING A SEMICONDUCTOR DEVICE

[75] Inventors: Shinji Yoshihara, Nagoya; Sumitomo Inomata, Toyota; Fumio Ohara; Takashi Kurahashi, both of Okazaki, all of Japan

[73] Assignee: Nippondenso Co., Ltd., Kariya, Japan

[21] Appl. No.: 678,822

[22] Filed: Jul. 12, 1996

[30] Foreign Application Priority Data

Jul. 13, 1995 [JP] Japan .................................. 7-177506

[51] Int. Cl.⁶ ......................... B32B 31/18; H01L 21/301
[52] U.S. Cl. ......................... 156/250; 156/292; 438/460; 438/464
[58] Field of Search .................... 156/247, 250, 156/275.5, 275.7, 292, 344, 510, 268; 437/226, 227; 264/319, 330, 345, 505, 544, 571; 438/460, 464

[56] References Cited

U.S. PATENT DOCUMENTS

| | | |
|---|---|---|
| 4,921,564 | 5/1990 | Moore ................................... 156/344 |
| 5,313,835 | 5/1994 | Dunn . | |
| 5,326,726 | 7/1994 | Tsang et al. . | |
| 5,435,876 | 7/1995 | Alfaro et al. ....................... 156/250 X |
| 5,447,068 | 9/1995 | Tang . | |
| 5,597,767 | 1/1997 | Mignardi et al. ................... 437/226 X |

FOREIGN PATENT DOCUMENTS

| | | |
|---|---|---|
| 2-106947 | 4/1990 | Japan . |
| 6-204502 | 7/1994 | Japan . |
| 7-159181 | 6/1995 | Japan . |

*Primary Examiner*—Curtis Mayes
*Attorney, Agent, or Firm*—Cushman Darby & Cushman IP Group of Pillsbury Madison & Sutro LLP

[57] ABSTRACT

A semiconductor wafer, which can be divided into chips at a high yield and a low cost and easily handled during transfer thereof as well, is disclosed. In a semiconductor wafer of such structure that structures with a low mechanical strength, such as suspended microstructures, are exposed at a surface thereof, detachable adhesive sheet making up protective caps for the respective suspended microstructures are formed over the semiconductor wafer. By means of this, even if the semiconductor wafer is diced into the individual chips, respective microstructures on chips are protected from the external force, such as the pressure of cutting water, during the dicing process.

17 Claims, 9 Drawing Sheets

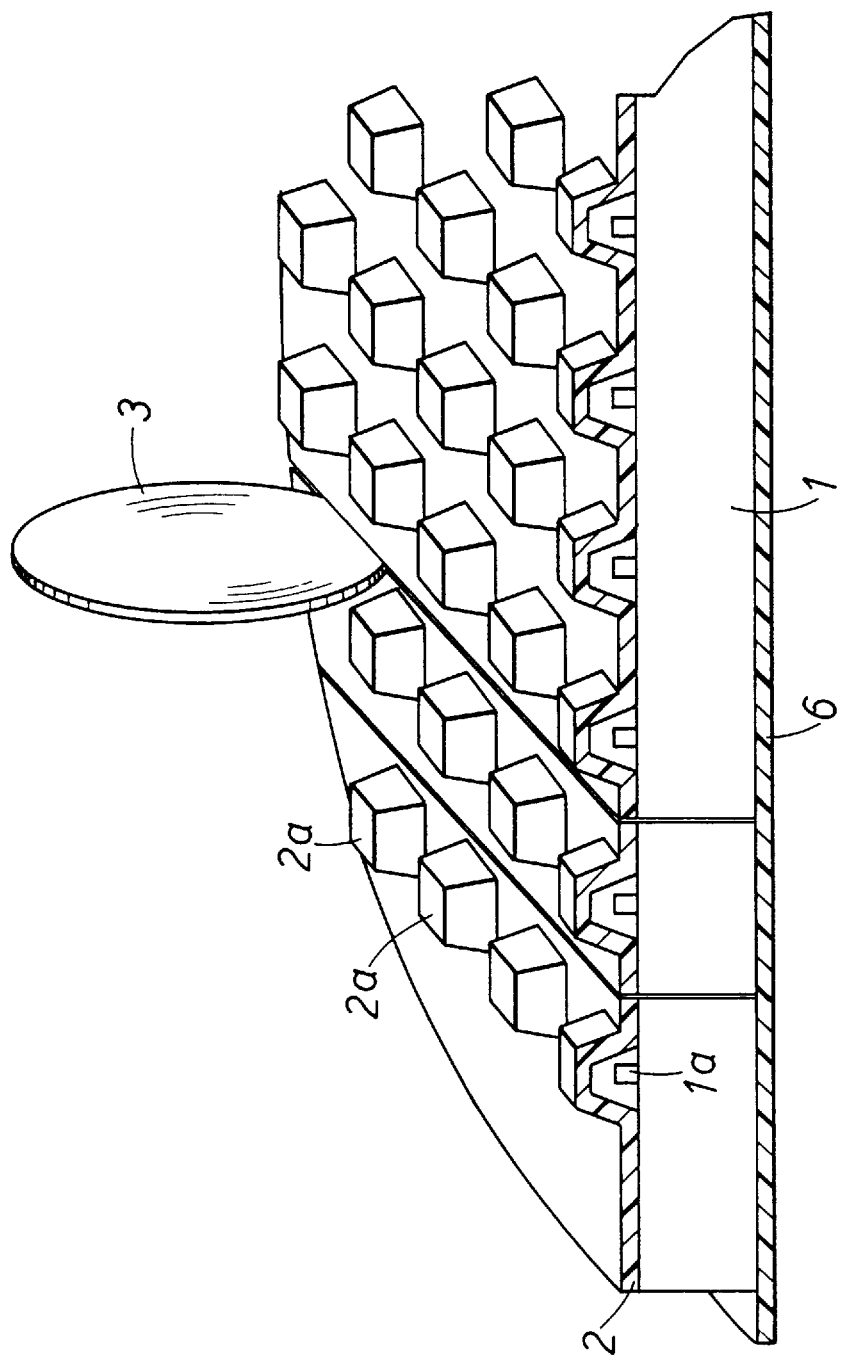

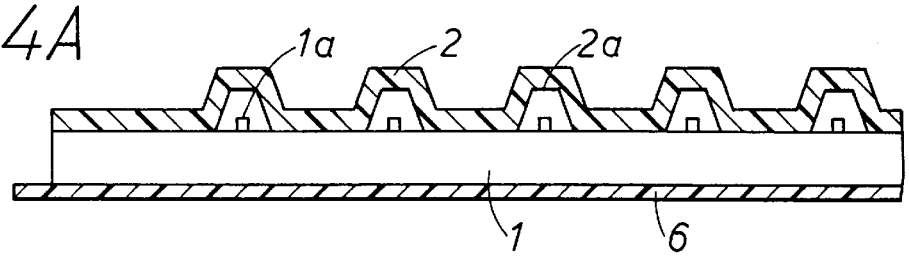
FIG. 4A
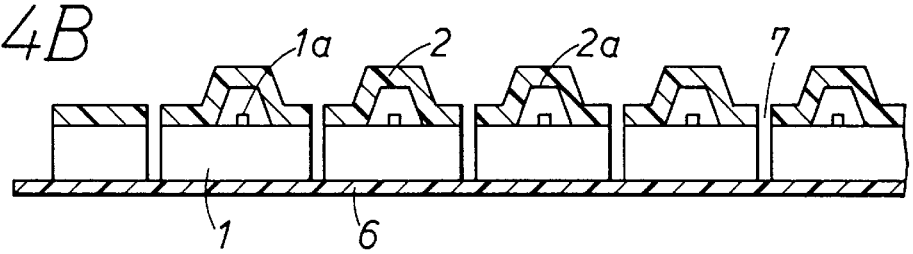
FIG. 4B
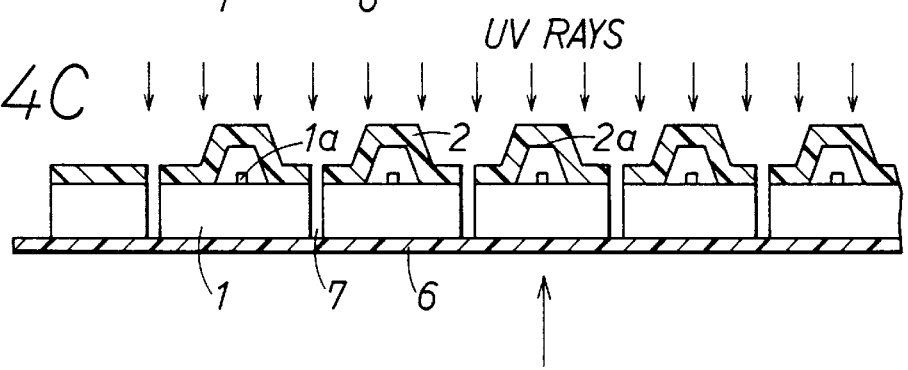
FIG. 4C
FIG. 4D
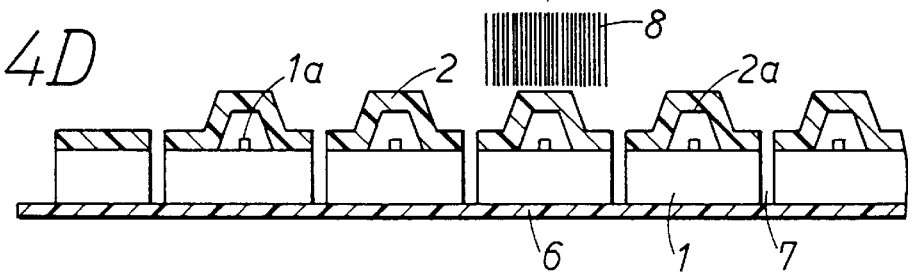
FIG. 4E
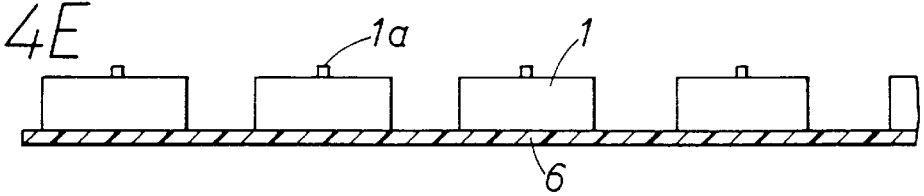

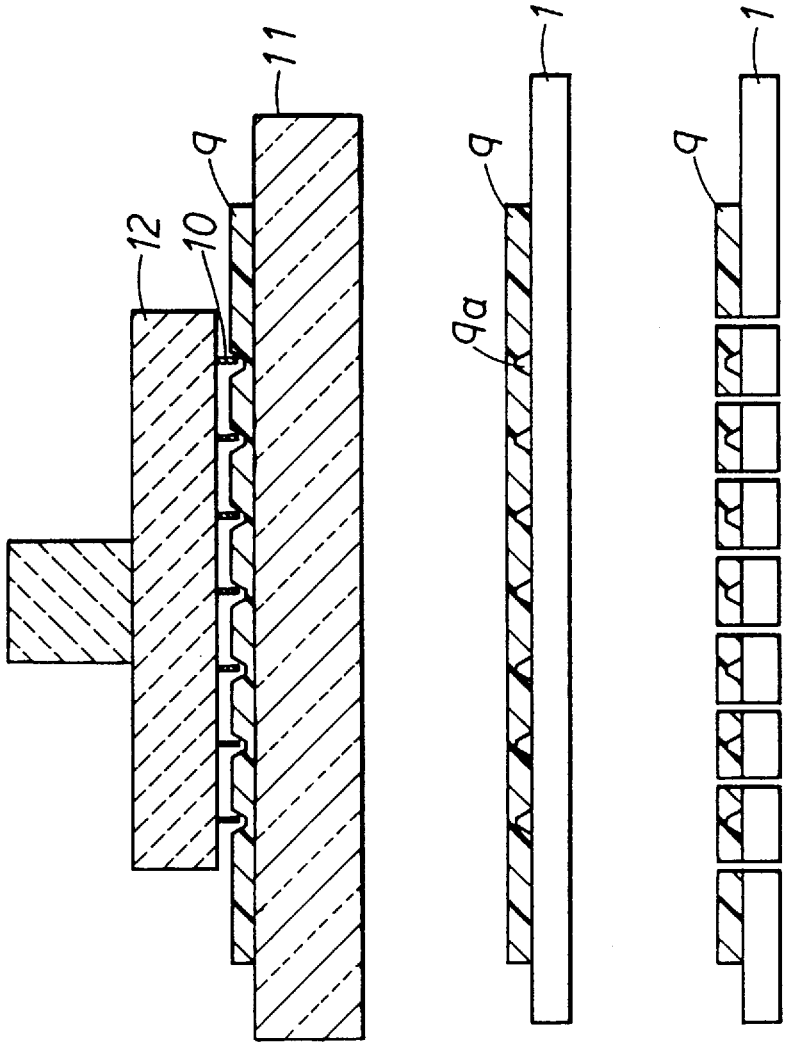

METHOD FOR MANUFACTURING A SEMICONDUCTOR DEVICE

CROSS REFERENCE TO RELATED APPLICATION

This application is based upon and claims the benefit of priority of the prior Japanese Patent Application No. 7-177506 filed on Jul. 13, 1995, the contents of which are incorporated herein by reference.

BACKGROUND OF THE INVENTION

1. Field of the Invention

The present invention generally relates to semiconductor devices and manufacturing methods therefor. More particularly, the present invention relates to a semiconductor device which has a movable part within one chip like a MOS transistor type acceleration sensor or a pressure sensor, a semiconductor device which has a structure with a low mechanical strength like air bridge wiring structure, and manufacturing methods for such semiconductor devices.

2. Related Arts

Conventionally, dividing semiconductor circuit elements formed on a semiconductor wafer, such as silicon wafer, into a plurality of chips has usually been achieved by dicing the semiconductor wafer placed on an adhesive wafer sheet.

In this procedure, the semiconductor wafer has been divided into a plurality of chips while flowing a large volume of pure water over the semiconductor wafer to remove silicon sawdust, radiate cutting heat and facilitate cutting.

However, when a silicon chip contains an element having movable parts, such as MOS transistor type acceleration sensor, or structures with a low mechanical strength, such as air bridge wiring structure, the pressure and surface tension of a large volume of pure water used may break these functional elements, resulting in abnormal operation.

To counter this problem, the Japanese Unexamined Patent Publication No. 2-106947 reveals a method in relation to the air bridge wiring structure that resist is coated to a wafer, the coated resist is hardened, the wafer is diced, UV rays are irradiated to the wafer within the ozone atmosphere, and thereby the resist is removed.

However, according to this method, resist remains unremoved in those areas to which the irradiation of UV rays can not be reached, and there has been no proper method of removing such remaining resist.

Furthermore, for the element which has movable parts, the movable parts may be broken by the viscosity of the resist or the rotation (angular velocity) of a spin coater during the coating thereof. Another defect is that extra men-hours are required in comparison with a mere dicing process.

As described above, according to the prior art, it is impossible to divide a semiconductor wafer on which structures with a low mechanical strength, such as the moving parts like a suspended microstructure for an acceleration sensor, the moving parts like the diaphragm for a pressure sensor, and an air bridge wiring structure, have been formed into chips at a high yield and a low cost.

Furthermore, in transferring a semiconductor wafer on which structures with a low mechanical strength have been formed, care must be directed not to allow the structures with a low mechanical strength to be contaminated by the surrounding environment, and this makes it difficult to handle such semiconductor in transferring.

SUMMARY OF THE INVENTION

In view of these problems, it is an object of the present invention to provide such semiconductor devices and manufacturing methods that can divide a semiconductor wafer on which structures with a low mechanical strength have been formed into chips at a high yield and a low cost.

It is another object of the present invention to provide such semiconductor devices and manufacturing methods therefor that can prevent a semiconductor wafer in transferring from contamination and facilitate the handling of the semiconductor wafer in transferring.

To achieve the object, a semiconductor wafer which contains semiconductor devices having structures of a low mechanical strength is characterized by a cover sheet which has cap portions disposed to protect the structures of a low mechanical strength. Herein, it is preferable that the cover sheet be a detachable sheet. Also, a method for manufacturing the semiconductor device according to the present invention is characterized by covering the semiconductor wafer with the cover sheet and then dicing the semiconductor wafer into the individual chips (individual semiconductor devices) while protecting the structures of a low mechanical strength with the cap portions of the cover sheet.

BRIEF DESCRIPTION OF THE DRAWINGS

These and other objects, features and characteristics of the present invention will be appreciated from a study of the following detailed description, the appended claims, and figures, all of which form a part of this application. In the figures:

FIG. 1 is a perspective view illustrating the correlations between a semiconductor device according to a first embodiment of the present invention and a dicing blade;

FIGS. 4A through 4E are sectional views illustrating the latter half part of the process flow of dicing according to the first embodiment;

FIGS. 5A through 5C are sectional views for use in describing a second embodiment;

DETAILED DESCRIPTION OF THE PRESENTLY PREFERRED EXEMPLARY EMBODIMENTS

Figure 2A:
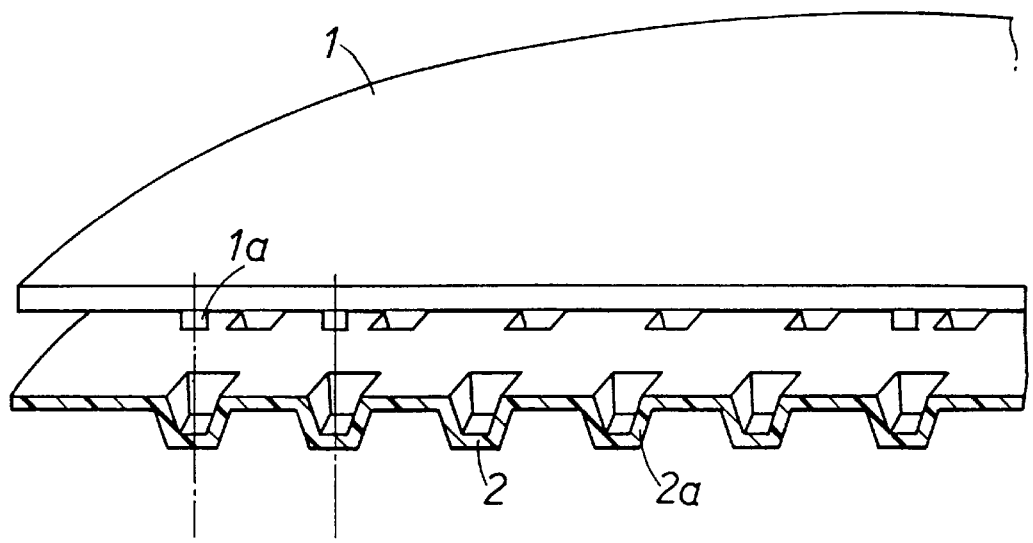
FIGS. 2A and 2B are perspective views illustrating the correlations between a semiconductor wafer, an adhesive sheet and a jig according to the first embodiment of the present invention by halving these components.

In the following paragraphs, the preferred embodiments of the present invention will be described by referring to the appended figures.

In the first place, a first embodiment will be outlined. FIG. 1 illustrates the correlations between semiconductor devices of this embodiment and a dicing blade. Firstly, a plurality of semiconductor devices respectively having suspended microstructures 1a with a low mechanical strength, such as movable parts and projections, are formed on a disk-like semiconductor wafer (hereinafter briefly referred to as "wafer") 1. As the suspended microstructures 1a with a low mechanical strength are known monolithic sensing elements disclosed in, for example, U.S. Pat. No. 5,313,835, U.S. Pat. No. 5,326,726, and Japanese Unexamined Patent Publication Nos. 6-204502 and 7-159181, or an air bridge wiring disclosed in, for example, Japanese Unexamined Patent Publication No. 2-106947, all of which are incorporated by reference. Secondly, detachable protective caps 2a are formed in positionally correspondence to the movable parts or projections, i.e., the suspended microstructure 1a, as per process flow (described later). Thirdly, the wafer 1 is diced by a dicing blade 3 into individual chips (individual semiconductor devices). For the protective caps 2a, an adhesive sheet (described later) is used. Here, it should be noted that those wafers which have not yet diced into chips by the dicing blade 3 but cut to a considerable extent (half cut or semi full cut wafer) are also included in a category of the wafer 1.

Figure 2B:
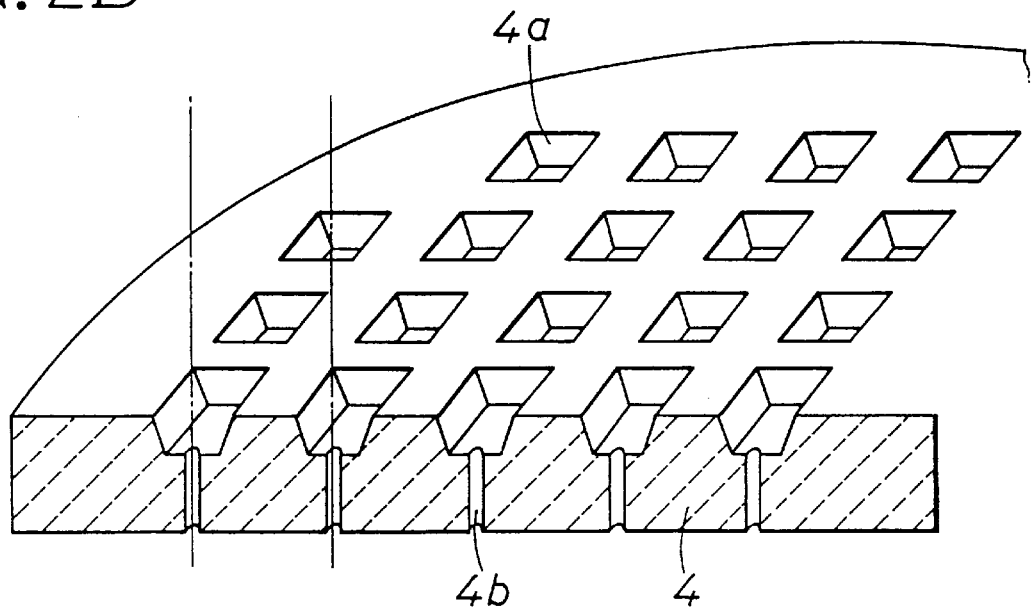

FIGS. 2A and 2B illustrate the correlations among a jig 4, adhesive sheet 2 and semiconductor wafer 1 to be used for this embodiment by halving these components. The above-described protective caps 2a have been realized as recessed parts formed in areas facing the suspended microstructures 1a respectively as illustrated in FIG. 2A. As described below, these recessed parts are formed by the jig 4 having shaping recessed parts 4a and adhesive sheet sucking through holes 4b therewithin (FIG. 2B); the first adhesive sheet 2 is sucked and transformed through the shaping recessed part 4a.

As a material for the adhesive sheet transforming jig 4 for use in this embodiment, a high-rigidity material (e.g., metal and ceramic) is used. However, the most suitable material is the tradename "MICHOL", which is a free-cutting ceramic material. Alternatively, the tradename "PHOTOVEIL" may be used, which is a composite micaceramic material produced by the melting method by which the microcrystals of fluoric gold mica zirconia are uniformly deposited by using the vitreous material as a matrix. As a method of making the through holes 4b and the shaping recessed parts 4a in the jig 4, a drill or laser cutting is used.

Next, the process flow of dicing related to the first embodiment will be described.

Figure 3A:
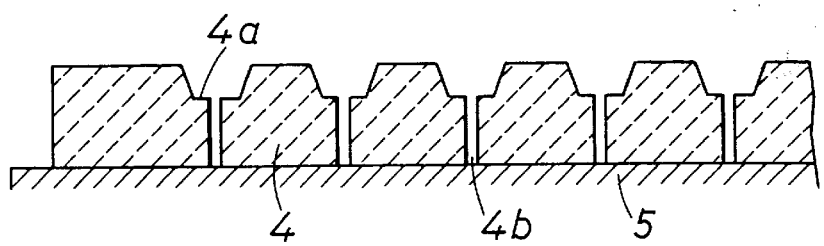
FIGS. 3A through 3E are sectional views illustrating the first half part of a process flow of dicing according to the first embodiment.

Firstly, as illustrated in FIG. 3A, on a vacuum chuck stage 5 is mounted the jig 4 having the through holes 4b in the respective shaping recessed parts 4a. Here, the shaping recessed part 4a is necessary when the through hole 4b is small in diameter due to the structure of the jig 4, but the shaping recessed part 4a is not always necessary. The number of the through holes 4b may be more than one for each shaping recessed part 4a according to the shape of the protective cap 2a. When UV rays are used for removing the protective cap 2a finally from the individual chips, if the sidewalls of the shaping recessed part 4a are tapered enough to secure the sufficient irradiation of UV rays, there will be no adhesive remains unremoved on the cap edge parts.

Figure 3B:
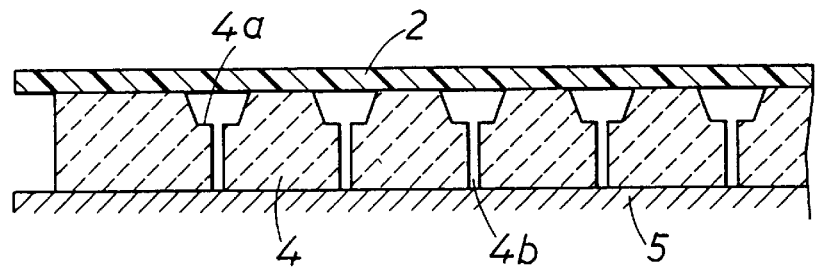

Secondly, as illustrated in FIG. 3B, the first adhesive sheet 2 is stuck to the front surface of the jig 4 with the adhesive surface facing above. Here, as the first adhesive sheet 2, an UV setting adhesive sheet, the adhesive strength of which is degraded by the irradiation of UV rays, is used. The adhesive strength should preferably be high to prevent the invasion of cutting water into the chip surface. Here, an adhesive sheet having a peeling strength of 1,000 g/25 mm is selected.

Figure 3C:
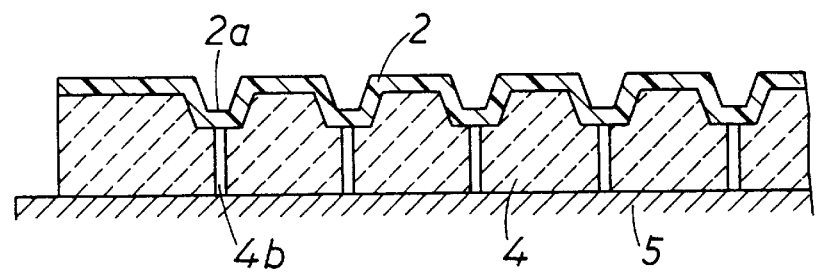

Thirdly, as illustrated in FIG. 3C, the first adhesive sheet 2 is sucked and bent by the vacuum chuck stage 5 through the through holes 4b within the jig 4. Then, the jig 4, together with the first adhesive sheet 2, is heated within a temperature range of 40° C. to 100° C. As evident from FIG. 9, the temperature range should preferably be 50° C. to 70° C.

Figure 9:
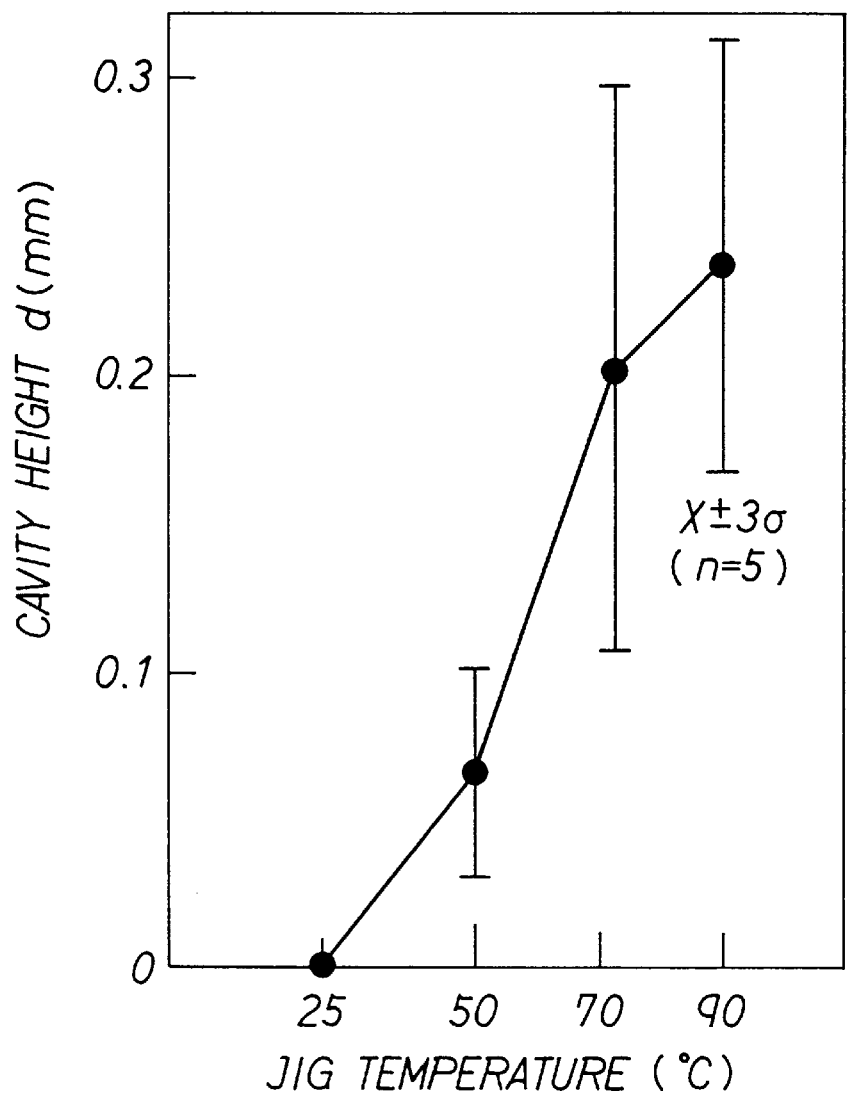
FIG. 9 is a graph illustrating the relationship between jig heating temperature and cavity height d.
Figure 10:
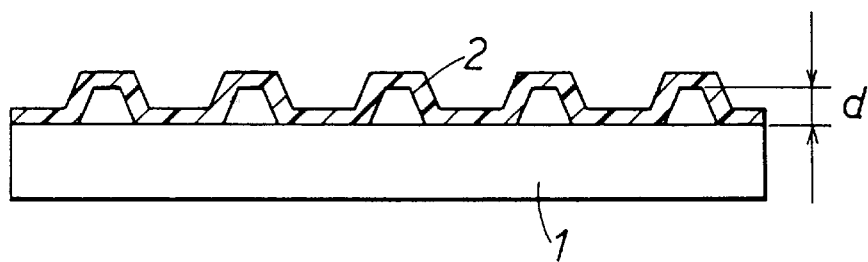
FIG. 10 is a sectional view for use in describing the cavity height d.

FIG. 9 illustrates the relations between the jig heating temperature and a cavity height d (FIG. 10). The first adhesive sheet 2, the base material of which is polyolefin, was heated with the jig 4, then cooled to the room temperature, then left for 1 hour, and then the cavity height d was measured. FIG. 9 illustrates the results of this measurement. Here, the recessed part 4a within the jig 4 was set to 0.3 mm in depth and 1.7 mm in square side. In some cases, the first adhesive sheet 2 warps in heating. To prevent such warping, if the first adhesive sheet 2 is fixed by a metallic frame or the like beforehand, the weight of the metallic frame itself or the like can prevent the warping. After reaching the desired temperature, the jig 4 and the first adhesive sheet 2 are cooled to the room temperature (30° C. or less), and the shape of the first adhesive sheet 2 is caused to be maintained. Although on the shape of the first adhesive sheet 2 is reflected the shapes of the insides of the shaping recessed parts 4a of the jig 4, it is needless to say that the shape of the first adhesive sheet 2 may vary according to the thickness, material and heating conditions of the first adhesive sheet 2. If the first adhesive sheet 2 fixed with a metallic frame is mounted on the jig 4 and sucked after the jig 4 and the vacuum chuck stage 5 are heated to the desired temperature, the shapes of the protective caps 2a can be stabilized.

Figure 3D:
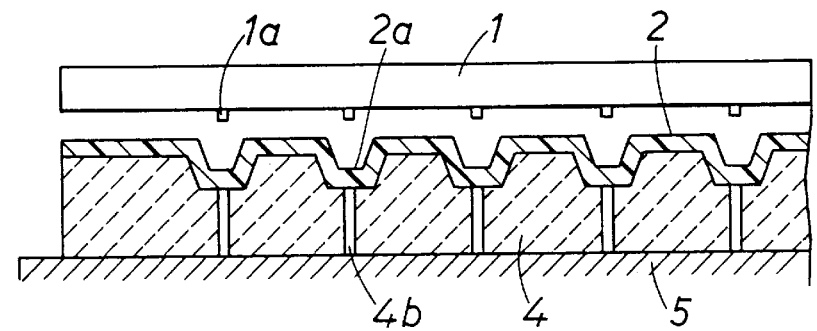
Figure 7A:
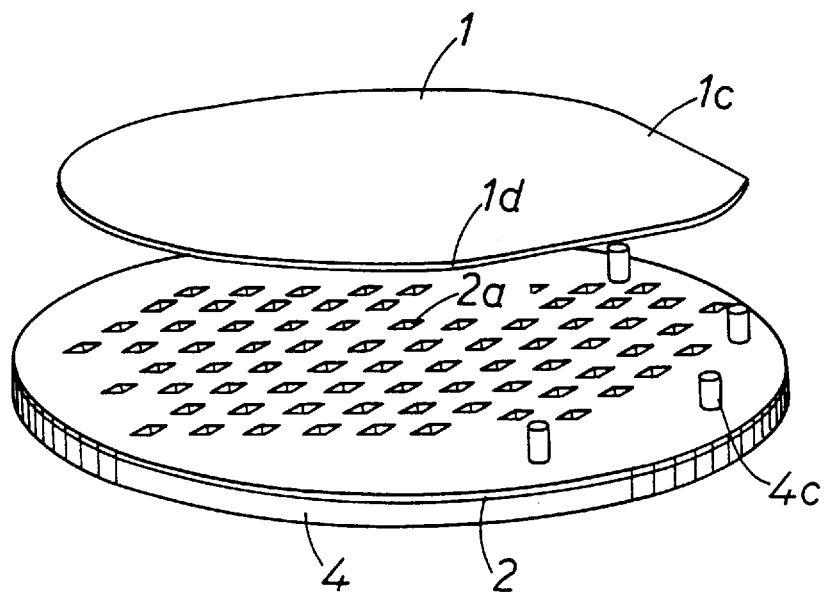
FIGS. 7A and 7B are perspective views for use in describing a method of positionally matching a wafer and a first adhesive sheet used for the first embodiment.
Figure 7B:
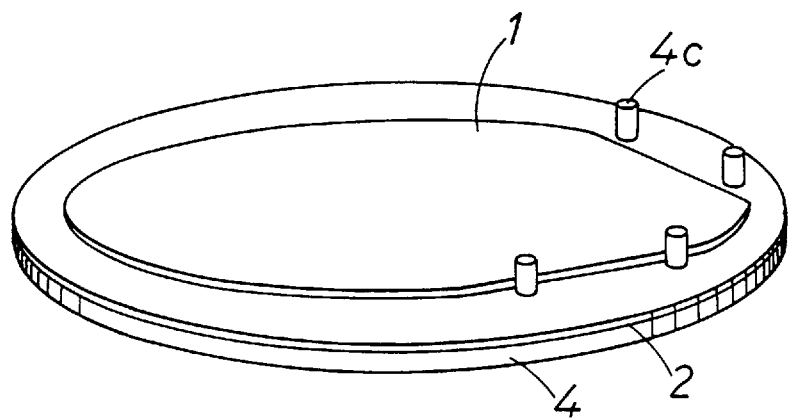

Fourthly, as illustrate in FIG. 3D, the wafer 1 having the suspended microstructures 1a is stuck fast to the first adhesive sheet 2. In this case, for example, as illustrated in FIGS. 7A and 7B, the wafer 1 is cut to have two positioning lines 1c and 1d at different positions with the microstructures 1a completely fixed thereon (with a sufficient mechanical strength obtained) beforehand; pins 4c are erected on the jig 4 for guiding the wafer 1; the positioning lines 1c and 1d of the wafer 1 and the pins 4C on the jig 4 are in such positional relations that the suspended microstructures 1a on the wafer 1 can be housed within the shaping recessed parts 4a within the jig 4 (FIGS. 2A and 2B). Alternatively, the wafer 1 and the first adhesive sheet 2 may be positionally matched by directly matching the pattern of the wafer 1 with the pattern of the first adhesive sheet 2 using pattern recognition technique.

The fast sticking of the wafer 1 to the first adhesive sheet 2 may be performed before the jig 4 and the first adhesive sheet 2 are cooled.

Figure 3E:
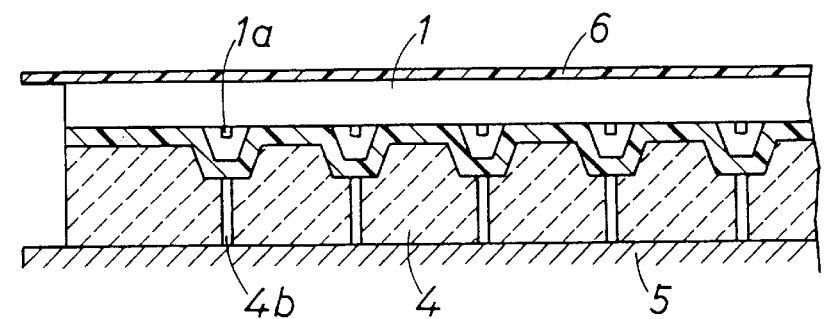

Fifthly, as illustrated in FIG. 3E, a second adhesive sheet 6 is stuck to the back surface of the wafer 1. The second adhesive sheet 6 may be either an UV setting adhesive sheet or a pressure sensitive adhesive sheet. When the pressure sensitive adhesive sheet is used, and when the first adhesive sheet 2 is removed by heating as performed in the next process, an adhesive sheet higher in heat resistance than the first adhesive sheet 2 should be selected.

When the first adhesive sheet 2 is provided with a metallic frame, the second adhesive sheet 6 should be stuck after removing the metallic frame for the first adhesive sheet 2.

Sixthly, as illustrated in FIG. 4A, suction through the through holes 4b within the jig 4 is stopped, and then the wafer 1 attached with the first adhesive sheet 2 and the second adhesive sheet 6 is removed from the jig 4.

Furthermore, it may be possible to conduct other processes for obtaining the construction of FIG. 4A. For example, after sticking the wafer 1 on the first adhesive sheet 2, the jig 4 and the first adhesive sheet 2 are cooled sufficiently (FIG. 3D). Then, suction through the through holes 4b within the jig 4 is stopped to remove the wafer 1 attached with the first adhesive sheet 2 from the jig 4. Subsequently, the periphery of the first adhesive sheet 2 is cut off to measure to the shape of the wafer 1, and the wafer 1 with the first adhesive sheet 2 is placed and stuck on the second adhesive sheet 6 supported by a wafer frame (metallic frame). By these processes, the construction of FIG. 4A can also be obtained.

Seventhly, as illustrated in FIG. 4B, the wafer 1 is diced together with the first adhesive sheet 2 along scribe line 7.

Eighthly, as illustrated in FIG. 4C, when an UV setting adhesive sheet is used as the first adhesive sheet 2, the adhesive strength thereof is degraded by the irradiation of UV rays.

Ninthly, as illustrated in FIG. 4D, the first adhesive sheet 2 (i.e., individual protective caps 2a) is removed by picking up the same with a vacuum tweezers 8, a third adhesive sheet, a tape, an adhesive or a needle-like sharply pointed tool. Alternatively, it may also be so arranged that after the dicing and before the removing, the cut parts of the first adhesive sheet 2 are melted with a heat source, such as soldering iron, and thereby the adjacent cut parts separated for the respective chips are joined together into a complete sheet again. In this case, however, the adhesive strength of the first adhesive sheet 2 may be degraded by irradiating UV rays thereto after restoring the first adhesive sheet 2 into a complete sheet.

If the chip interval must be widened, as illustrated in FIG. 4E, it is recommendable to give a tensile force to the second adhesive sheet 6 in such a direction that the cuts of the wafer 1 can be widened to widen the chip interval. This chip interval widening process may be effectuated before the removal of the first adhesive sheet 2.

Now, a second embodiment of the present invention will be described.

In the first embodiment, recessed parts are formed in an adhesive sheet 2 by vacuum sucking the same through the through holes 4b within the jig 4. Alternatively, however, as illustrated in FIGS. 5A through 5C, recessed parts may also be formed by locally melting an adhesive sheet 9 (corresponding to the first adhesive sheet 2 of the first embodiment) with heated needle-like projections (hereinafter briefly referred to as "needle") 10. In this case, it is not always necessary to contact the needle 10 with the adhesive sheet 9. An advantage of this method is that both a jig 12 and the wafer 1 need not to be heated or cooled. It takes a considerably long time to heat or cool the jig 12 and the wafer 1 due to the respective large heat capacities thereof. According to this modification, however, as heat is locally applied to the adhesive sheet 9, the respective heat capacities of the jig 12 and wafer 1 becomes extremely small, and the throughput markedly improves. Furthermore, as air may unavoidably be taken in when the adhesive sheet 9 is stuck to the wafer 1, voids may be caused to between the wafer 1 and the adhesive sheet 9. According to this embodiment, however, unlike the first embodiment, as there is no projection parts on the front surface of the adhesive sheet 9 (i.e., the surface on the side opposite to the wafer side), the taken-in air can be driven out of between the wafer 1 and the adhesive sheet 9 by using a roller or the like when the adhesive sheet is being stuck to the wafer 1. Therefore, the sticking can be achieved without causing any voids.

Next, by referring to FIGS. 5A through 5C, the manufacturing procedure for the second embodiment will be described.

Firstly, as illustrated in FIG. 5A, the adhesive sheet 9 is disposed on a support 11. Then, the needles 10 provided on the front surface of a jig 12 are heated, and the heated needles 10 are lowered in an approach to or to be in contact with the adhesive sheet 9 to locally melt the adhesive sheet 9. Following this, the jig 12 is released from the adhesive sheet 9. The adhesive sheet 9 can be fixed by vacuum sucking if a device with a porous ceramic plate or the like, for example, mounted on a vacuum sucking stage is used as the support 11. Furthermore, if the adhesive sheet 9 is provided with a metallic frame, the adhesive sheet 9 can be fixed by the weight of the metallic frame itself.

Secondly, when melting parts 9a have been hardened, as illustrated in FIG. 5B, the wafer 1 is mounted on the adhesive sheet 9, and the wafer 1 is fixed by the adhesive of the adhesive sheet 9. In this process, the adhesive sheet 9 may be stuck to the wafer 1 by rolling a roller or the like over the adhesive sheet 9.

Finally, as illustrated in FIG. 5C, the wafer 1 is diced together with the adhesive sheet 9.

FIGS. 6A through 6D illustrate the manufacturing processes of a third embodiment according to the present invention. In this example of the third embodiment, the jig 12 provided with the needles 10 is pressed against the adhesive sheet 9 to forcedly transform the adhesive sheet 9. In the following paragraphs, the manufacturing processes of this modification will be described.

Figure 6A:
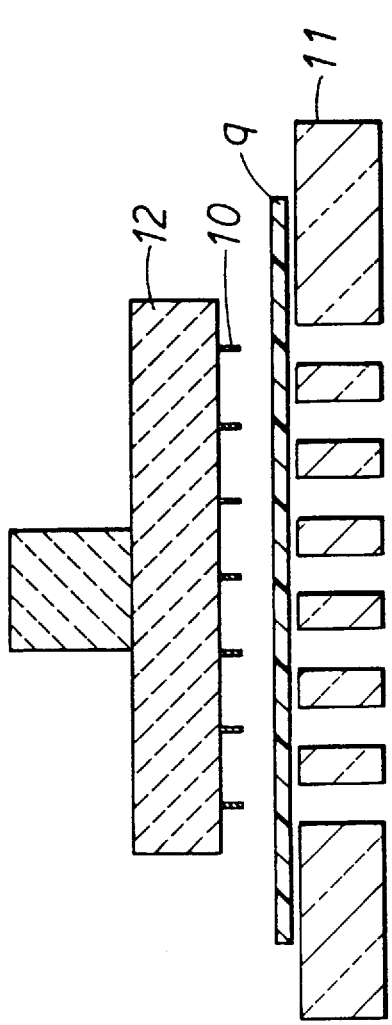
FIGS. 6A through 6D are sectional views for use in describing a third embodiment.
Figure 6B:
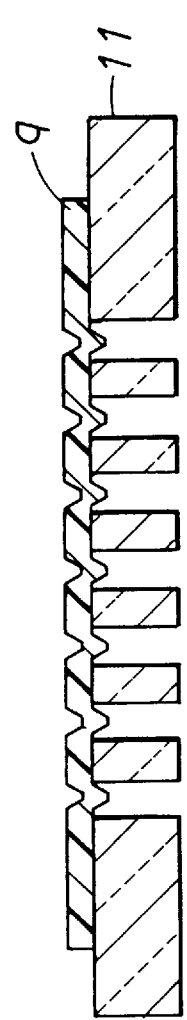

Firstly, as illustrated in FIGS. 6A and 6B, the adhesive sheet 9 is placed on the support 11, the jig 12 provided with the needles 10 is pressed against the adhesive sheet 9, and thereby the adhesive sheet 9 is forcedly transformed.

Figure 6C:
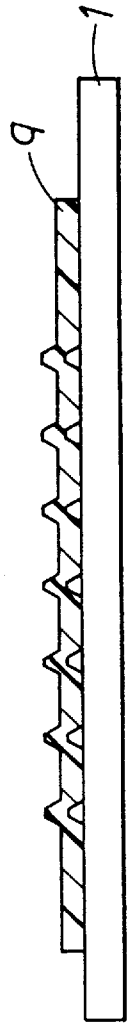

Secondly, as illustrated in FIG. 6C, the adhesive sheet 9 is disposed on the wafer 1.

Figure 6D:
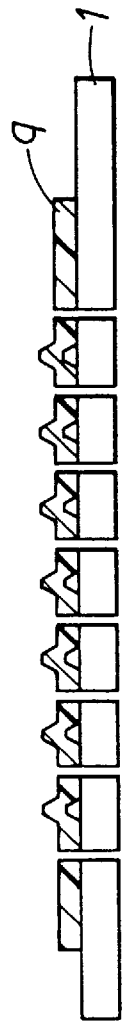

Finally, as illustrated in FIG. 6D, the wafer 1 is diced together with the adhesive sheet 9.

Now, a fourth embodiment according to the present invention will be described. In the first, second and third embodiments described above, the adhesive sheet 2 or 9 for providing the protective caps 2a is transformed into a desired shape by using a jig. In the fourth embodiment, however, the adhesive sheet 2 is transformed without using any jig.

In the following paragraphs, the dicing process flow according to the fourth embodiment will be described.

Figure 8A:
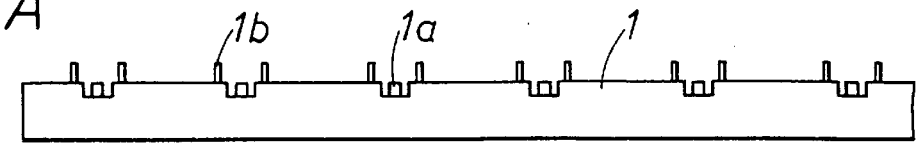
FIGS. 8A through 8F are sectional views illustrating a process flow of dicing according to a fourth embodiment.

Firstly, as illustrated in FIG. 8A, an adhesive or the like is printed on the wafer 1 on which semiconductor devices, such as semiconductor sensors having movable parts, have been formed, by, for example, screen process printing so as to surroundingly form walls 1b, which is composed of the printed adhesive or the like, around the respective suspended microstructures 1a. In this process, the adhesive is printed as high as possible by entering a filler or the like so that the first adhesive sheet 2, which is to be stuck in the subsequent process, can not contact the suspended microstructures 1a in dicing and also the height of the adhesive is controlled. The distance between the suspended microstructure 1a and the printed adhesive is shortened as much as possible. Then, by means of heating within an oven or the like, the adhesive is hardened to form the wall 1b.

Figure 8B:
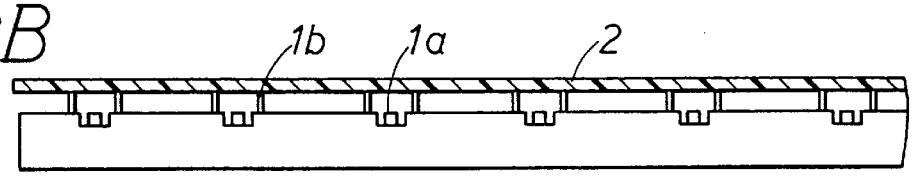

Secondly, as illustrated in FIG. 8B, the first adhesive sheet 2 is disposed over the walls 1b formed by printing the adhesive, and is then stuck on the front surface side of the wafer 1 with cavities secured therebetween by the erected walls 1b. Here, an UV setting adhesive sheet, the adhesive strength of which is degraded by the irradiation of UV rays, is supposed to be used. The adhesive strength should preferably be high enough to prevent the invasion of cutting water into the surfaces of the chips. Here, an adhesive sheet having a peeling strength of 1,000 g/25 mm is selected.

Figure 8C:
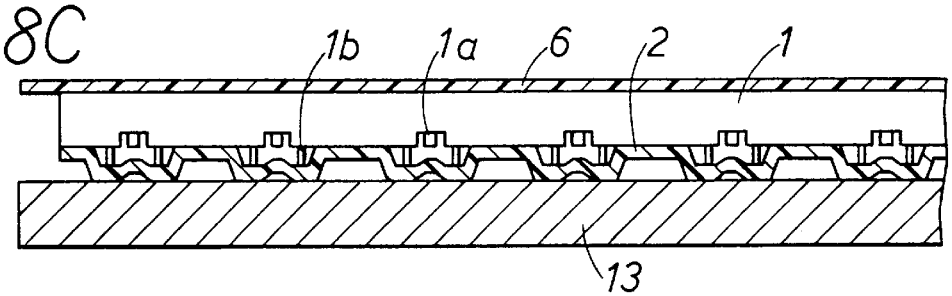

Thirdly, as illustrated in FIG. 8C, the wafer 1 to which the first adhesive sheet 2 has been stuck is placed on a vacuum chuck stage 13 and sucked, and the second adhesive sheet 6 is stuck to the back surface of the wafer 1. The vacuum chuck stage 13 may be a vacuum chuck stage for wafer mounters. The second adhesive sheet 6 may be either an UV setting adhesive sheet or a pressure sensitive adhesive sheet. However, if the first adhesive sheet 2 is a pressure sensitive sheet and removed by heating, an adhesive sheet having a higher heat resistance than that of the first adhesive sheet 2 should be selected as the second adhesive sheet 6.

If the first adhesive sheet 2 is provided with a metallic frame, the second adhesive sheet 6 should be stuck after removing the metallic frame.

Figure 8D:
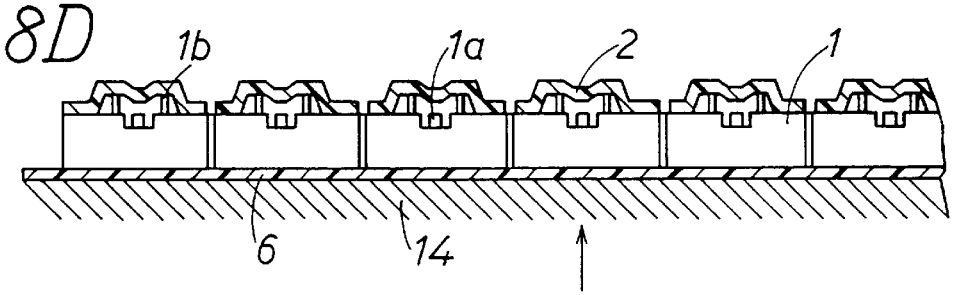

Fourthly, as illustrated in FIG. 8D, the first adhesive sheet 2 and the wafer 1 are fully diced from the front surface side of the wafer on which the first adhesive sheet 2 has been stuck toward a vacuum chuck stage 14.

Figure 8E:
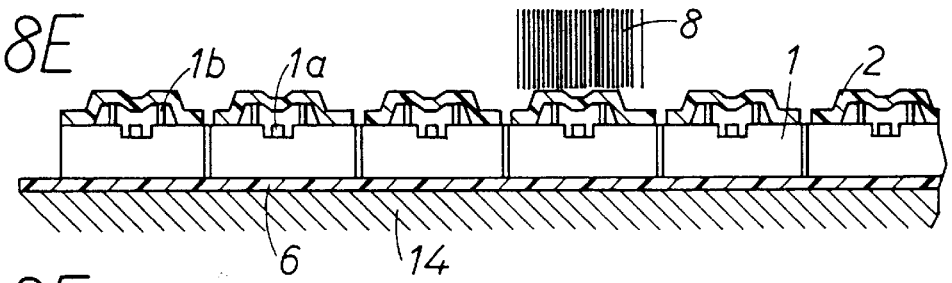

Fifthly, as illustrated in FIG. 8E, the first adhesive sheet 2 is removed by picking up the same with the vacuum tweezers 8, a third adhesive sheet or a sharply pointed tool.

Figure 8F:
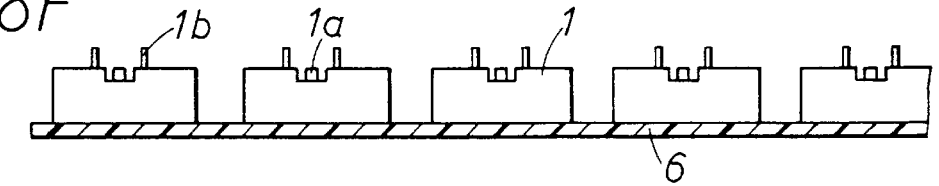

Finally, as illustrated in FIG. 8F, the chip intervals are widened by the ordinary expanding method described in the first embodiment.

Next, description will be given to a fifth embodiment according to the present invention. In the description of the above-described first through fourth embodiments, a dicing method for a semiconductor wafer on which structures with a low mechanical strength have been formed was described. In the fifth embodiment, however, protective caps for a semiconductor wafer on which structures with a low mechanical strength have been formed are formed. The process flow of this embodiment covers, as illustrated in FIGS. 3A through 3E and 4A, the processes until the first adhesive sheet 2 that makes up protective caps is stuck to the wafer 1. As the structures having a low mechanical strength are protected from external force during these processes, the wafer 1 can easily be transferred to the next process. The protective caps may be removed after the transfer or left as they are until the subsequent mounting process after dicing illustrated in FIG. 4B. Furthermore, if a conductive sheet is used as an adhesive sheet for protection, it is possible to take measures to counter electrostatic breakdown of peripheral circuitry.

According to the embodiments described above, being covered with the protective caps, the structures with a low mechanical strength on the wafer can be protected from the pressure of cutting water, the surface tension of cutting water and the adherence of sawdust. Furthermore, according to the construction described above, as there is no need to use viscous liquid, such as resist, for fixing the structures with a low mechanical strength, the semiconductor device on which the structures with a low mechanical strength have been formed can be diced without using a process for coating and removing viscous liquid, such as resist. Therefore, the semiconductor wafer on which the structures with a low mechanical strength have been formed can be divided into individual chips at a high yield and a low cost. Moreover, as the semiconductor wafer is protected by the protective caps during transfer, the semiconductor wafer can be protected from contamination, and at the same time, as the structures with a low mechanical strength are protected from external force, the semiconductor wafer can easily be handled during transfer.

As described above, according to the present invention, as the semiconductor wafer on which the structures with a low mechanical strength have been formed is protected by the protective caps during dicing, the semiconductor wafer can be divided into individual chips at a high yield and a low cost.

Furthermore, as the semiconductor wafer is protected by the protective caps during transfer, the semiconductor wafer can be protected from contamination, and the structures with a low mechanical strength is protected from external force. Therefore, the semiconductor wafer can easily be handled during transfer.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for handling a semiconductor wafer comprising:

preparing a protective sheet which has a recessed part by using an adhesive sheet; and sticking to a surface of a semiconductor wafer said prepared protective sheet so as to align said recessed part with a structure which is provided on said semiconductor wafer and has a mechanical strength capable of being broken by an external force, said protective sheet being stuck to said semiconductor wafer while there is a gap between said structure of said semiconductor wafer and an inner wall of said recessed part.

2. A method for manufacturing a semiconductor device, comprising:

forming on a semiconductor wafer a structure having a mechanical strength capable of being broken by an external force;

preparing an adhesive sheet which has a recessed part;

sticking said prepared adhesive sheet to a surface of said semiconductor wafer so that said recessed part is placed in a position facing said structure on said semiconductor wafer, thereby protecting said structure from said external force, said adhesive sheet being stuck to said semiconductor wafer while there is a gap between said structure of said semiconductor wafer and an inner wall of said recessed part; and dicing said semiconductor wafer together with said adhesive sheet.

3. A method for handling a semiconductor wafer comprising:

preparing a protective sheet which has a recessed part by using an adhesive sheet; and sticking to a surface of a semiconductor wafer said prepared protective sheet so as to align said recessed part with a structure which is provided on said semiconductor wafer and has a mechanical strength capable of being broken by an external force, whereby said structure is protected from said external force, said protective sheet comprising a conductive material.

4. A method for handling a semiconductor wafer comprising:
preparing a protective sheet by:
placing, on a front surface of a jig having a recess and a through hole communicated with said recess, a raw adhesive sheet with an adhesive surface thereof facing above; and
sucking said raw adhesive sheet through said through hole to form a recessed part on said adhesive sheet; and
sticking to a surface of a semiconductor wafer said prepared protective sheet so as to align said recessed part with a structure which is provided on said semiconductor wafer and has a mechanical strength capable of being broken by an external force, whereby said structure is protected from said external force.

5. A method for handling a semiconductor wafer according to claim 4, wherein said step of preparing a protective sheet includes: after said sucking:
heat-treating said adhesive sheet sucked along with said jig at a temperature range from 40° C. to 100° C.; and
cooling down said adhesive sheet.

6. A method for manufacturing a semiconductor device, comprising:
forming on a semiconductor wafer a structure having a mechanical strength capable of being broken by an external force;
preparing an adhesive sheet having a recessed part by,
placing, on a front surface of a jig having a recess and a through hole communicated with said recess, a raw adhesive sheet with an adhesive surface thereof facing above; and
sucking said raw adhesive sheet using said through hole to thereby form said recessed part on said adhesive sheet;
sticking said prepared adhesive sheet to a surface of said semiconductor wafer so that said recessed part is placed in a position facing said structure on said semiconductor wafer, thereby protecting said structure from said external force; and
dicing said semiconductor wafer together with said adhesive sheet.

7. A manufacturing method according to claim 6, further comprising, before said placing, processing a free-cutting ceramic material to prepare said jig having said recess and said through hole.

8. A manufacturing method according to claim 6, further comprising, after said sucking:
heat-treating said adhesive sheet sucked along with said jig at a temperature range from 40° C. to 100° C.; and
cooling down said adhesive sheet.

9. A method for manufacturing a semiconductor device according to claim 6, further comprising, before said dicing, sticking another adhesive sheet to a back surface of said semiconductor wafer.

10. A method for handling a semiconductor wafer comprising:
preparing a protective sheet by:
placing, on a support having a recess, a raw adhesive sheet with an adhesive surface thereof facing above; and
pressing a needle part which is provided on a jig against said raw adhesive sheet to forcedly form a recessed part on said adhesive sheet; and
sticking to a surface of a semiconductor wafer said prepared protective sheet so as to align said recessed part with a structure which is provided on said semiconductor wafer and has a mechanical strength capable of being broken by an external force, whereby said structure is protected from said external force.

11. A method for manufacturing a semiconductor device, comprising:
forming on a semiconductor wafer a structure having a mechanical strength capable of being broken by an external force;
preparing an adhesive sheet having a recessed part by,
placing, on a support having a recess, a raw adhesive sheet with an adhesive surface thereof facing above; and
pressing a needle part which is provided on a jig against said raw adhesive sheet to thereby forcedly form said recessed part on said adhesive sheet;
sticking said prepared adhesive sheet to a surface of said semiconductor wafer so that said recessed part is placed in a position facing said structure on said semiconductor wafer, thereby protecting said structure from said external force; and
dicing said semiconductor wafer together with said adhesive sheet.

12. A method for manufacturing a semiconductor device according to claim 11, further comprising, before said dicing, sticking another adhesive sheet to a back surface of said semiconductor wafer.

13. A method for handling a semiconductor wafer comprising:
preparing a protective sheet by:
placing, on a support, a raw adhesive sheet with an adhesive surface thereof facing above; and
bringing a jig having a heated needle part on a surface thereof close to said raw adhesive sheet or pressing said needle part against said raw adhesive sheet to thereby form a recessed part on said adhesive sheet; and
sticking to a surface of a semiconductor wafer said prepared protective sheet so as to align said recessed part with a structure which is provided on said semiconductor wafer and has a mechanical strength capable of being broken by an external force, whereby said structure is protected from said external force.

14. A method for manufacturing a semiconductor device, comprising:
forming on a semiconductor wafer a structure having a mechanical strength capable of being broken by an external force;
preparing an adhesive sheet having a recessed part by,
placing, on a support, a raw adhesive sheet with an adhesive surface thereof facing above; and
bringing a jig having a heated needle part on a surface thereof close to said raw adhesive sheet or pressing said needle part against said raw adhesive sheet to thereby form said recessed part on said adhesive sheet;
sticking said prepared adhesive sheet to a surface of said semiconductor wafer so that said recessed part is placed in a position facing said structure on said semiconductor wafer, thereby protecting said structure from said external force; and
dicing said semiconductor wafer together with said adhesive sheet.

15. A method for manufacturing a semiconductor device according to claim 14, further comprising, before said dicing, sticking another adhesive sheet to a back surface of said semiconductor wafer.

16. A method for manufacturing a semiconductor device, comprising:

forming on a semiconductor wafer a structure having a mechanical strength capable of being broken by an external force;

preparing an adhesive sheet which has a recessed part;

forming walls around said structure on said semiconductor wafer using a transferable or printable adhesive material;

sticking said adhesive sheet to a surface of said semiconductor wafer in such a manner that a cavity is secured around said structure by said walls; and dicing said semiconductor wafer together with said adhesive sheet.

17. A method for manufacturing a semiconductor device according to claim 16, further comprising, before said dicing, sticking another adhesive sheet to a back surface of said semiconductor wafer.

* * * * *